July 3, 1962 R. T. MYERS 3,042,885
TUNED CIRCUIT FILTER
Filed June 17, 1959 2 Sheets-Sheet 1
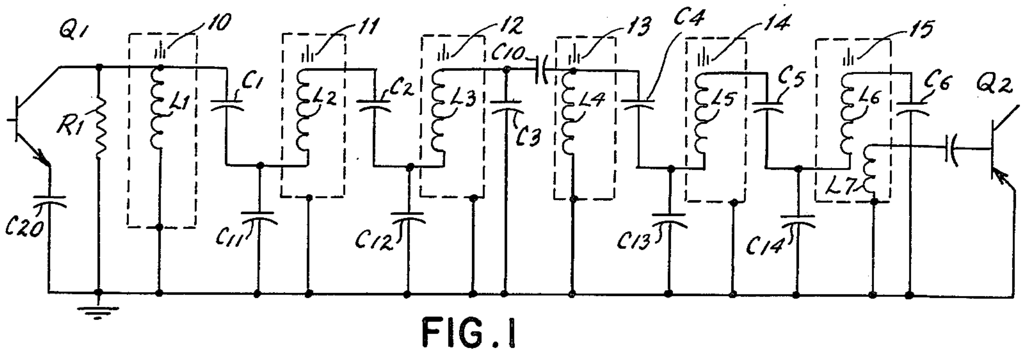
FIG. 1
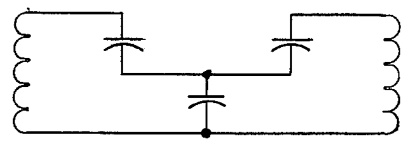
FIG. 2A
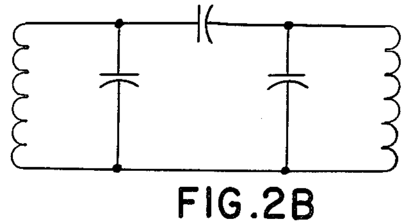
FIG. 2B
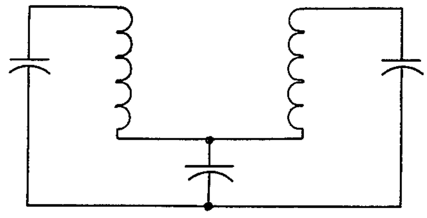
FIG. 2C
FIG. 2
Richard T. Myers
INVENTOR.
BY Joseph P. Kates
ATTORNEY Richard T. Myers
*INVENTOR.*

BY Joseph P. Kates

ATTORNEY 3,042,885
TUNED CIRCUIT FILTER
Richard T. Myers, Lynchburg, Va., assignor to General Electric Company, a corporation of New York
Filed June 17, 1959, Ser. No. 820,986
2 Claims. (Cl. 333—76)

Figures 3, 4:
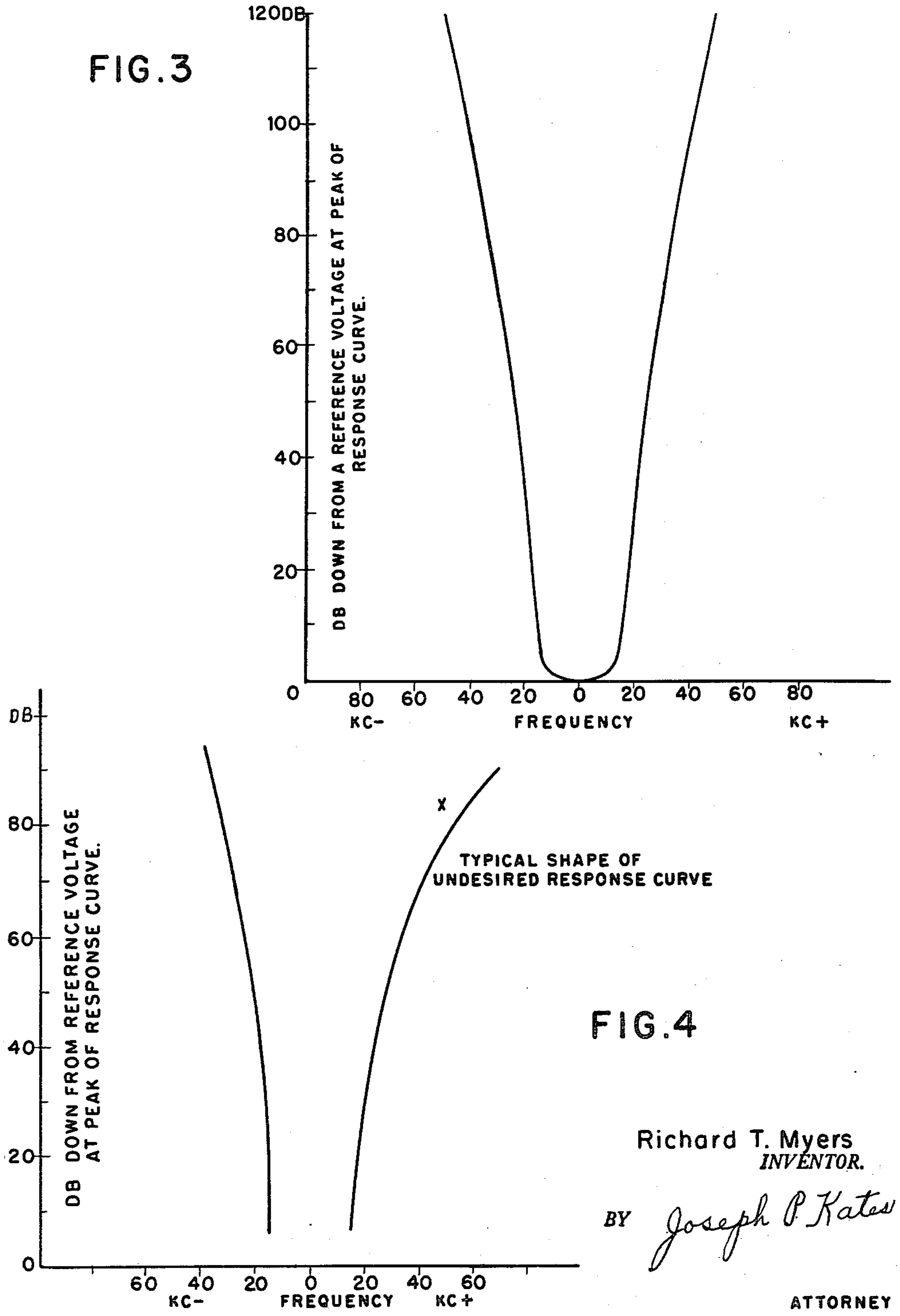

The present invention relates to a tuned circuit filter and more particularly relates to a multiple-tuned circuit filter with symmetrical response above and below desired frequency in which a plurality of coils which are not inductively coupled to each other, are coupled by means of capacitors in a manner such that the response of the filter above and below center frequency is symmetrical to 80 decibles (db) down from a reference voltage at the peak of the frequency response curve of the filter.

In prior art tube circuits it was possible in the relatively large volume I.F. (intermediate frequency) cans utilized to alternately capacitively couple and inductively couple between pairs of tuned elements in a plurality of tuned stages such that a balanced output curve could be obtained. However, in transistorized receivers or other transistorized devices wherein a plurality of tuned I.F. stages must be coupled together to present a miniaturized strip this method cannot be employed because of the miniature ization problem. In a miniaturized strip, a single inductor of the tuned circuit is placed in a relatively very tiny ferrite ceramic core and a minimum of space is permitted between the inductor and the surrounding wall. It is impossible to inductively couple within this small space without causing too tight coupling and resulting loss of energy or failure to couple. That is, by placing two inductors in a single ferrite container, the coupling therebetween would be so tight that an undesirably wide bandwidth would result. This method is therefore impractical for a receiver wherein restricted bandwidth is required. This problem makes it necessary to capacitively couple each tuned stage to the next succeeding tuned parallel circuit. This method, however, produces a filter with frequency response which has undesirable unbalance between the low frequency side and the high frequency side. As shown by the frequency response curve of such a device, particularly on the high frequency side the curve levels off such that undesirable high frequency noises are not attenuated and are, therefore, heard at the speaker. A balanced frequency response (which shows balanced frequency response on the curve, therefore) is necessary up to at least 80 decibels from reference at the center frequency of the bandwith passed by the filter for this undesired noise to be less than excessive. Prior art systems utilize an inductor and capacitor and a tuned capacitor and coupling capacitor in parallel. Such prior art systems are described in "Reference Data for Radio Engineers," on page 238, (copyright by International Telephone and Telegraph Company, 67 Broad Street, New York 4, New York, American Book-Stratford Press, Inc., New York, New York, 4th ed., 2nd printing, January 1957). As seen by the curves shown in this reference on page 240 chapter 8, "Simple Band Pass Filter Design," the curve on the low side is not symmetrical with the curve on the high side. That is, prior art filter circuits for transistorized device applications have less attenuation above the center frequency than below the center frequency. This causes a prior art device disadvantage of unwanted high frequency noises appearing at the speaker.

The multiple-tuned circuit filter device and method of the present invention overcomes this and other disadvantages of prior art multiple-tuned circuit filters and in addition provides an economical and feasible filter which will have the necessary balanced frequency response as shown by the frequency response curve therefor. The present invention is also particularly adaptable to miniaturization wherein disposition of coils in ferrite ceramic casings should be able to be readily effected.

Accordingly an object of the present invention is to provide a multiple-tuned circuit filter which will have characteristics of balanced response on the high and low sides of center frequency of the band of frequencies which the filter is expected to pass.

Another purpose of the present invention is to provide a multiple-tuned circuit filter which will be adaptable to miniaturization and wherein equal response on the high and low sides of the center frequency of the bandpass frequencies may be maintained.

Another aim of the present invention is to provide a multiple-tuned circuit filter especially adaptable to all or substantially all-transistorized electronic equipment such as radio receivers and wherein ferrite ceramic shielding of cores may be incorporated and wherein considerations of miniaturization and light weight are important.

Another object of the present invention is to provide a multiple-tuned circuit filter especially adaptable to transistorized, light weight, low-power miniaturized receiver applications and which will have balanced response to frequencies on both sides of center frequency of a band of frequencies to be passed by the filter.

Another purpose of the present invention is to provide a multiple-tuned circuit filter which will provide balanced response and substantially equal attenuation of frequencies above and below the center frequency of a bandpass desired to be effected in a transistorized and miniaturized receiver wherein noise due to unequal attenuation especially on the high frequency side of center frequency will be eliminated and will not appear at the speaker.

While the novel and distinctive features of the invention are particularly pointed out in the appended claims, a more expository treatment of the invention, in principle and in detail, together with additional objects and advantages thereof is afforded by the following description and accompanying drawing in which:

FIG. 1 is a schematic representation of a circuit illustrating a preferred embodiment of the filter of the present invention, FIG. 2 comprises FIGS. 2A, 2B and 2C which are schematic representations of prior art filter devices and methods of coupling, FIG. 3 is a graphical representation of a desirable curve of frequency response plotted against decibels down from a reference voltage at the peak of the response curve for a receiver bandpass filter which type of symmetrical curve is provided by the filter of the present invention, and FIG. 4 is a schematic representation of an undesirable frequency response curve of frequency response of prior art filters (as the filters shown in FIG. 2) plotted against decibels down from a reference voltage at the peak of the response curve.

Now referring to the drawings and in particular to FIG. 1 a transistor stage Q1 preceding the filter of the invention may be provided. Transistor stage Q1 could be the mixer stage or an i.f. stage of a receiver, for example. Transistor Q1 may have a collector, a base and an emitter. A capacitor C2 may be provided to function as the bypass capacitor for the emitter of transistor Q1. Disposed between the collector of transistor Q1 and ground may be a resistor R1. Resistor R1 provides grounding and fine control of the bandwidth and it permits use of a lower Q in the first coil if that were advantageous. Actually in manufacture of the embodiment of the invention of FIG. 1 the Q of the coils are made identical since the coils used are manufactured with identical Q's, and are readily so obtainable. The multi-tuned circuit filter of the invention, which in the illustrative embodiment of FIG. 1 may be a six tuned circuit filter, couples stage Q1 to a stage Q2 which may be provided and may be responsive to output from the filter. Stage Q2 may be an intermediate frequency amplifier stage and may comprise a transistor having an emitter, a collector and a base. It will be appreciated that because transistors shown are PNP transistors the grounding occurs at the lower end of the component shown in FIG. 1. In the case of an NPN transistor, reverse polarities or power supply connection could be effected. Disposed across resistor R1 may be an inductor L1 which may be contained in a miniature ferrite ceramic cup for shielding purposes. Disposed across inductor L1 may be a tuning capacitor C1 and a coupling capacitor C11 in series. Coupling capacitor C11 may also be common to a second tuned circuit which may comprise an inductor L2 in series with coupling capacitor C11. Inductor L2 may similarly be contained in a ferrite cup. Inductor L2 may be disposed between coupling capacitor C11 and a tuning capacitor C2 which may be disposed in series therewith. A coupling capacitor C12 may be disposed between tuning capacitor C2 and ground and may couple energy to a third inductor L3 which may be disposed in series with coupling capacitor C12. The shield or ferrite cup of each of the inductors L1, L2 and L3 may be grounded. Center core tuning of each of inductors L1, L2 and L3 may be provided by moveable tuning slugs 10, 11 and 12 respectively, such that these circuits may be tuned to resonance at the I.F. frequency.

Disposed in series with the end of inductor L3 opposite its end connected to coupling capacitor C12 may be a tuning capacitor C3. Capacitor C3 may be grounded at its side opposite its inductor L3 connected side. A coupling capacitor C10 disposed on the high side (ungrounded side of the filter) may provide coupling between two groups of three tuned circuits. The first group may comprise the group containing inductors L1, L2 and L3 and the second group will be described hereinafter. Capacitor C10 may be disposed between the high side of inductor L3 and the high side of an inductor L4. Inductor L4 may be disposed between the coupling capacitor C10 and ground. Across inductor L4 may be provided a tuning capacitor C4 and a coupling capacitor C13. In series with coupling capacitor C13 may be a fifth inductor L5. Disposed in series with inductor L5 may be a tuning capacitor C5 and a coupling capacitor C14 leading to ground. Disposed in series with coupling capacitor C14 may be a sixth inductor L6. Disposed in series with inductor L6 may be a tuning capacitor C6 which is connected between the high side of inductor L6 and ground. As in the case of the first group comprising inductors L1, L2 and L3, coupling capacitors C11 and C12 and tuning capacitors C1, C2 and C3; the coupling capacitors C13 and C14 may be common to the first and succeeding tuned circuit of inductor L4 and tuning capacitor C4, inductor L5 and tuning capacitor C5 and inductor L6 and tuning capacitor C6 respectively. That is, coupling capacitor C13 will be common to the circuit of inductor L4 and capacitor C4 and to the circuit of inductor L5 and tuning capacitor C5; and capacitor C14 will be common to the circuit of inductor L5 and tuning capacitor C5 and to the circuit of inductor L6 and tuning capacitor C6.

A second transistor stage Q2 which may be an I.F. (intermediate frequency) amplifier stage may be provided and may be responsive to the output of the filter. Transistor Q2 may comprise an emitter, a collector and a base. Tight coupling for impedance match of transistorized I.F. stage Q2 may be provided by an inductor L7 which may be provided. Transformer action may be effected by disposition of inductor L7 with relation to inductor L6 so as to cause coupling between inductor L6 and L7. The number of turns ratio may be 345 for L6 to 25 for L7 which may provide for proper impedance match from the impedance at the filter at inductor L6 to the low impedance input of the transistor stage Q2.

Inductive tuning for inductors L4, L5 and L6 may be provided by moveable tuning slugs 13, 14 and 15 respectively.

In operation of the receiver, assume a signal at the I.F. frequency is applied to the filter at inductor L1. The signal will be developed across the parallel resonant tuned circuit comprising inductor L1 and tuning capacitor C1 and will be coupled by capacitor C11 to the second parallel resonant circuit comprising inductor L2 and tuning capacitor C2. It should be understood that the value of capacitors C1 and C2 respectively should be modified because of the capacitance of the coupling capacitor C11 in series with and common to both filter stages. That is, there should be also provided additional capacitance such that the total capacitance of the tuning capacitor and coupling capacitor in series provides the capacitance required for each inductive-capacitive parallel circuit of the filter. Similarly coupling may be effected from the second filter stage comprising inductors L2 and C2 by means of coupling capacitor C12 to the parallel tuned circuit comprising inductor L3 and tuning capacitor C3. Tuning capacitor C3 may be disposed between the high side of inductor L3 and ground. As stated hereinbefore, the first group of three parallel circuits may be represented by inductor L1 and capacitor C1, inductor L2 and capacitor C2, and inductor L3 and capacitor C3, (in conjunction with coupling capacitors C11 and C12) and the second group of these parallel circuits may be represented by inductor L4 and capacitor C4, inductor L5 and capacitor C5 and inductor L6 and capacitor C6 (in conjunction with coupling capacitors C13 and C14). Coupling capacitor C10 couples on the high (ungrounded) side of the filter the coupling between the first and second group of three tuned circuits. That is, the signal on being coupled through capacitor C10 is developed by the second group first parallel filter circuit comprising inductor L4 and tuning capacitor C4 in series with coupling capacitor C13. Coupling capacitor C13 then couples the signal to the second parallel circuit comprising inductor L5 and tuning capacitor C5 in series with coupling capacitor C14. Coupling capacitor C14 then couples the signal to the third stage comprising inductor L6 and tuning capacitor C6 which capacitor C6 is disposed between the high side of inductor L6 and ground, inductor L6 being in series with capacitor C14. The coupling capacitors C13 and C14, respectively, each perform both the coupling function and also provide additional capacitance to affect slightly the size of the tuning capacitors C4, C5 and C6, respectively. On the signal being applied to the inductor L6 of the sixth filter stage, tightly coupling transformer action is effected; the signal being coupled to the secondary L7 of the transformer comprising inductor L6 and inductor L7 to thereby effect proper impedance match for the low impedance input of the second I.F. stage transistor.

By means of this filtering arrangement whereby the coupling is effected between the tuning capacitor in each tuned filter stage to an inductor of the following stage in series therewith between the first and second stage and between the second and third stage of the first three stages and between the fourth and fifth stages and between the fifth and sixth stage of the last three stages of filtering and by means of separating the filters into groups of three stages and coupling between the groups of three tuned stages of filtering a balanced output response as shown in FIG. 3 may be obtained. By coupling the groups of three stages by means of group coupling capacitor C10 some compensation is effected for the flair which would otherwise result. Such coupling, therefor, causes a balanced output curve of frequency versus attenuation to be obtained, which curve is symmetrical on both sides of the center frequency at the band of frequencies transmitted. Providing groups of three filter stages makes manufacturing more convenient and cheaper in providing filtering strips. Also, as stated hereinabove, by use of only one compensating coupling capacitor on the high side additional flair which might be caused otherwise is eliminated.

Thus, in the device of FIG. 1 six coils which are not inductively coupled to each other are coupled by means of capacitors so that symmetrical frequency response above and below the center frequency of a band of frequencies passed by this filter arrangement may be obtained to points 80 decibels (db) down from reference voltage at the center (peak) frequency. Thus in the filter of FIG. 1 as inductor L1 may be tuned by capacitors C1 and C11 in series, coil or inductor L2 may be tuned by capacitors C2, C11 and C12 in series and these two stages may be coupled by the common impedance of capacitor C11. Inductor L3 may be tuned by capacitors C3 and C12 in series. Inductors L2 and L3 may be coupled by the common impedance of capacitor C12. Inductor or coil L4 may be tuned by capacitors C4 and C13 in series. Inductors L3 and L4 may be coupled by capacitor C10. Inductor or coil L5 may be tuned by capacitors C5, C13 and C14 in series. Inductors L4 and L5 may be coupled by the common impedance of capacitor C13. Inductor L6 may be tuned by capacitors C6 and C14 in series. Inductors L5 and L6 may be coupled by the common impedance of capacitor C14. Signal energy may be fed from inductor L6 to the following amplifier Q2 by the close coupled link L7, for example. In operation the resonant circuits may be adjusted to the same frequency by loading down the stages with resistance and then adjusting each inductor or coil for maximum response at predetermined center frequency.

The problem of prior art filter circuits which usually have less attenuation above the center frequency than below in the band of frequencies passed may be solved by improving attenuation of the higher frequencies by placing inductors L2, L3, L5, and L6 in series with the signal path rather than in shunt with the signal path. Inductors L1 and L4 may be disposed in shunt connection to help the lower frequency attenuation. The combinations of capacitors C1 and C11, capacitors C2 and C12, capacitors C4 and C13 and capacitors C5 and C14 may act as capacitive voltage dividers both above and below the desired center frequency. The impedance $$\left(\text{capacitive reactance } x_c = \frac{1}{2\pi fC}\right)$$

of capacitor C10 decreases as the frequency increases so that less attenuation of frequencies above than below center frequency is effected. A well balanced frequency response is thereby provided by the invention.

Now referring to FIGS. 2A, 2B and 2C wherein prior art type of coupling is effected it may be seen that the type of curve represented in FIG. 4 will result which curve shows that prior art coupling creates unsymmetrical frequency response on the high side as compared with the low side. In such filters upon receiving a signal within the range under 80 db attenuation, the signal (which might be an unwanted signal) as at $x$ will appear at the speaker. In the device of FIG. 2A, the tuning capacitor of the second parallel resonant circuit is disposed in series with the tuning capacitor of the first tank circuit and the coupling capacitor is disposed in a manner similar to that of the circuit of the present invention. The device of FIG. 2A, however, results in a frequency response evidenced by a curve as in FIG. 4 which is unsymmetrical on the high side. This difficulty is not alleviated by the coupling arrangement of FIG. 2B. In the device of FIG. 2B the output of the parallel resonant tank circuit shown at the left side of that figure is coupled on the high side by a capacitor to the output parallel resonant tank circuit shown at the right of FIG. 2B. In the device of FIG. 2B a distorted curve is produced also. A distorted curve representing frequency response also results where coupling is effected from the first parallel circuit to the second parallel resonant circuit by inserting the two inductors in series and tied to the common coupling capacitor as shown in FIG. 2C. In each of the devices of FIGS. 2A, 2B and 2C considerable distortion of the curve either on the low side or the high side will result and the receiver in which such filter is disposed will be ineffective to prevent noise occuring from energy at unwanted frequencies within the frequency band. That is by a very simple structural change of a bandpass filter and without addition of components which change comprises placing the inductor in series with the tuning capacitor of the previous stage and effecting common coupling to a common coupling capacitor as, for example, shown in FIG. 1 by tuning capacitor C1 in series with inductor L2 and common coupling capacitor C11 a startling new and unexpected result is obtained in that a symmetrical output frequency response is obtained. This is shown by the frequency response curve obtained by the invention. Thus by employing the relatively simple inventive means and method described herein of reversing positioning of the inductor and capacitor in the succeeding stage of a tuned circuit filter an unexpected result of very desirable symmetrical frequency response on the high side and on the low side of center frequency is obtained and unwanted noise at the speaker within the bandpass of frequencies is eliminated.

The present invention thereby provides a fixed tuned circuit filter which has a minimum of elements and wherein a good response curve is effected and wherein grouping is effected in an economical manner.

While in nowise to be considered as limiting the scope of the present invention an illustrative embodiment constructed and measured and operated on a frequency of 290 kc. (kilocycles) utilized the following values of components:

| Component—Capacitor: | Value, u.u.f. (micromicro farads) |
|---|---|
| C1 | 100 |
| C2 | 100 |
| C3 | 100 |
| C4 | 100 |
| C5 | 100 |
| C6 | 100 |
| C10 | 5.6 |
| C11 | 730 |
| C12 | 1210 |
| C13 | 1210 |
| C14 | 1320 |

| Resistor: | Ohms |
|---|---|
| R1 | 82,000 |

The test of this unit produced results as follows:

*Frequency Change in kc. From 290 kc. To Produce This Attenuation*

| Attenuation in db | Above 290 kc. | Below 290 kc. |
|---|---|---|
| 6 | 15.5 | 15.5 |
| 20 | 19.0 | 19.5 |
| 40 | 25.5 | 26.3 |
| 60 | 34.0 | 33.7 |
| 80 | 35.0 | 37.7 |

The bandwidth of this unit may be changed by replacing C10, C11, C12 and C14. Another unit was constructed with the following values:

C10 becomes 4.0 m.m.f.
C11 becomes 1500 m.m.f.
C12 becomes 2000 m.m.f.
C13 becomes 2000 m.m.f.
C14 becomes 2200 m.m.f.

The following measurements were taken on this unit:

*Frequency Change in kc. From 290 kc. To Produce This Attenuation*

| Attenuation db | Above | Below |
|---|---|---|
| 6 | 9.0 | 8.6 |
| 20 | 12.7 | 11.8 |
| 40 | 17.9 | 17.1 |
| 60 | 24.7 | 24.3 |
| 80 | 28.3 | 29.9 |

While a specific embodiment of the invention has been shown and described, it should be recognized that the invention should not be limited thereto. It is accordingly intended in the appended claims to claim all such variations as fall within the true spirit of the invention.

What is claimed is:

1. A band pass filter circuit comprising a first parallel resonant L-C circuit including an inductor and voltage dividing capacitor in shunt with said inductor, a second parallel resonant circuit including an inductor and a plurality of voltage dividing capacitors in shunt with said inductor, one end of the inductor of said second parallel resonant circuit being connected to the junction of the voltage dividing capacitors of said first resonant circuit, an input terminal connected to one end of said first resonant circuit, the other end of each of said first and second resonant circuits being connected to a common reference point, said plurality of capacitors in said second resonant circuit including the capacitor of said first resonant circuit connected between the said junction and the common reference point, output terminals connected to said second parallel resonant circuit whereby said filter circuit has a balanced frequency response on either side of the band pass center frequency.

2. In a band pass filter arrangement comprising at least first and second filter sections, each of said filter sections including at least a first parallel resonant L-C circuit comprising an inductor and voltage dividing capacitor in shunt therewith, a second parallel resonant L-C circuit including an inductor and a plurality of voltage dividing capacitors in shunt with said inductor, one end of the inductor of said second parallel resonant circuit being connected to the junction of voltage dividing capacitors of said first resonant circuit, an input terminal connected to one end of said first resonant circuit, the other end of each of said first and second resonant circuits connected to a common reference point, said plurality of capacitors in said second resonant circuit including the capacitor of said first resonant circuit connected between the said junction and the common reference point, output terminals connected to said second parallel resonant circuit, and capacitive coupling means connected between the output terminal of said first section and the input terminal of said second section whereby said filter arrangement has a balanced frequency response on either side of the band pass center frequency.

References Cited in the file of this patent

UNITED STATES PATENTS

| | | |
|---|---|---|
| 1,227,114 | Campbell | May 22, 1917 |
| 1,587,574 | Zobel | June 8, 1926 |
| 1,604,981 | Elsasser | Nov. 2, 1926 |
| 1,985,042 | Lane | Dec. 18, 1934 |
| 2,531,231 | Million | Nov. 21, 1950 |
| 2,710,315 | Tongue | June 7, 1955 |
| 2,774,866 | Burger | Dec. 18, 1956 |